(12) United States Patent
Lai et al.

(10) Patent No.: US 7,262,078 B2
(45) Date of Patent: Aug. 28, 2007

(54) METHOD OF FORMING A WEAR-RESISTANT DIELECTRIC LAYER

(75) Inventors: Wei-Shun Lai, Chang-Hua Hsien (TW); Shu-Hua Hu, Tai-Chung (TW); Kuan-Jui Huang, Kao-Hsiung Hsien (TW); Chin-Chang Pan, Taipei Hsien (TW); Yuan-Chin Hsu, Chia-Yi Hsien (TW)

(73) Assignee: Touch Micro-System Technology Inc., Yang-Mei, Taoyuan Hsien (TW)

( * ) Notice: Subject to any disclaimer, the term of this patent is extended or adjusted under 35 U.S.C. 154(b) by 401 days.

(21) Appl. No.: 10/906,972

(22) Filed: Mar. 15, 2005

(65) Prior Publication Data
US 2006/0183259 A1    Aug. 17, 2006

(30) Foreign Application Priority Data
Feb. 17, 2005    (TW) ............................... 94104661 A

(51) Int. Cl.
*H01L 21/44* (2006.01)
(52) U.S. Cl. .................. 438/108; 438/612; 438/689; 257/21.508
(58) Field of Classification Search ........ 438/584–688, 438/106–127
See application file for complete search history.

(56) References Cited

U.S. PATENT DOCUMENTS

| | | | |
|---|---|---|---|
| 5,693,565 A * | 12/1997 | Camilletti et al. ............ 438/17 |
| 6,372,545 B1 * | 4/2002 | Fan et al. .................... 438/108 |
| 6,827,868 B2 * | 12/2004 | Daubenspeck et al. ....... 216/17 |
| 6,943,059 B2 * | 9/2005 | Maeda ....................... 438/108 |
| 2003/0219987 A1 * | 11/2003 | Wang et al. ................. 438/720 |
| 2004/0157450 A1 * | 8/2004 | Bojkov et al. .............. 438/689 |
| 2004/0209452 A1 * | 10/2004 | Kim ........................... 438/613 |
| 2004/0235220 A1 * | 11/2004 | Maeda ....................... 438/106 |
| 2006/0068595 A1 * | 3/2006 | Seliger et al. .............. 438/737 |

* cited by examiner

*Primary Examiner*—Savitri Mulpuri
(74) *Attorney, Agent, or Firm*—Winston Hsu

(57) ABSTRACT

A substrate is provided. The substrate includes a plurality of devices disposed in the substrate, a plurality of contact pads disposed on a surface of the substrate and electrically connected to the devices, and a surface dielectric layer positioned on the surface of the substrate. Thereafter, a surface treatment process including at least a plasma etching process is performed. Subsequently, at least a plasma enhanced chemical vapor deposition (PECVD) process is performed to form a dielectric layer on a surface dielectric layer. The PECVD process is performed in a high frequency/low frequency alternating manner. Following that, a masking pattern on the dielectric layer is formed, and an anisotropic etching process is carried out to form a plurality of openings corresponding to the contact pads in the dielectric layer. The openings expose the contact pads, and each opening has an outwardly-inclined sidewall.

8 Claims, 8 Drawing Sheets

METHOD OF FORMING A WEAR-RESISTANT DIELECTRIC LAYER

BACKGROUND OF INVENTION

1. Field of the Invention

The present invention relates to a method of forming a wear-resistant dielectric layer, and more particularly, to a method of forming a wear-resistant dielectric layer by performing a plasma enhanced chemical vapor deposition (PECVD) process in a high frequency/low frequency alternating manner.

2. Description of the Prior Art

In the fabrication of semiconductor devices and MEMS (micro electromechanical system) devices, a dielectric layer mainly provides insulation and protection functions. For different purposes, some parameters of the dielectric layer, such as the electric constant, the material strength, and the stress between the dielectric and other materials that contact with the dielectric layer, must be considered. Generally, the dielectric layer is made of silicon oxide and silicon nitride. Silicon oxide has a higher electric constant, and the stress between silicon oxide and other semiconductor materials, e.g. a silicon substrate, is less. Consequently, silicon oxide is frequently used as a material of a gate insulating material. On the other hand, silicon nitride is more rigid, and therefore is mostly selected as a passivation layer of the semiconductor devices or the MEMS devices. For a passivation layer, wear-resistant and hydrophilic characteristics are required.

The stress between silicon nitride and other semiconductor materials is higher, and thus the thickness of a silicon nitride layer formed by deposition technique has its limit. Otherwise, cracking or peeling problems tend to appear. Normally, the stress of a silicon nitride layer exceeds 1000 MPa as long as the thickness of the silicon nitride layer is over several micrometers. In view of the high stress problem, the thickness of a silicon nitride layer is generally less than 1 micrometer.

SUMMARY OF INVENTION

It is therefore a primary object of the claimed invention to provide a method of forming a wear-resistant dielectric layer to overcome the aforementioned problem.

According to the claimed invention, a method of forming a wear-resistant dielectric layer is disclosed. First, a substrate is provided. The substrate includes a plurality of devices disposed in the substrate, a plurality of contact pads disposed on a surface of the substrate and electrically connected to the devices, and a surface dielectric layer positioned on the surface of the substrate. Thereafter, a surface treatment process including at least a plasma etching process is performed. Subsequently, at least a plasma enhanced chemical vapor deposition (PECVD) process is performed to form a dielectric layer on a surface dielectric layer. The PECVD process is performed in a high frequency/low frequency alternating manner. Following that, a masking pattern on the dielectric layer is formed, and an anisotropic etching process is carried out to form a plurality of openings corresponding to the contact pads in the dielectric layer. The openings expose the contact pads, and each opening has an outwardly-inclined sidewall.

According to the method of the present invention, a firm and low stress silicon nitride layer is formed by performing a PECVD process in a high frequency/low frequency alternating manner. In addition, outwardly-inclined openings are further formed in the silicon nitride layer, so that a good step coverage effect of the diffusion barrier layer and the seed layer is ensured. Accordingly, the solder bumps formed successively are well structured, and this improves the yield and reliability of following package process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
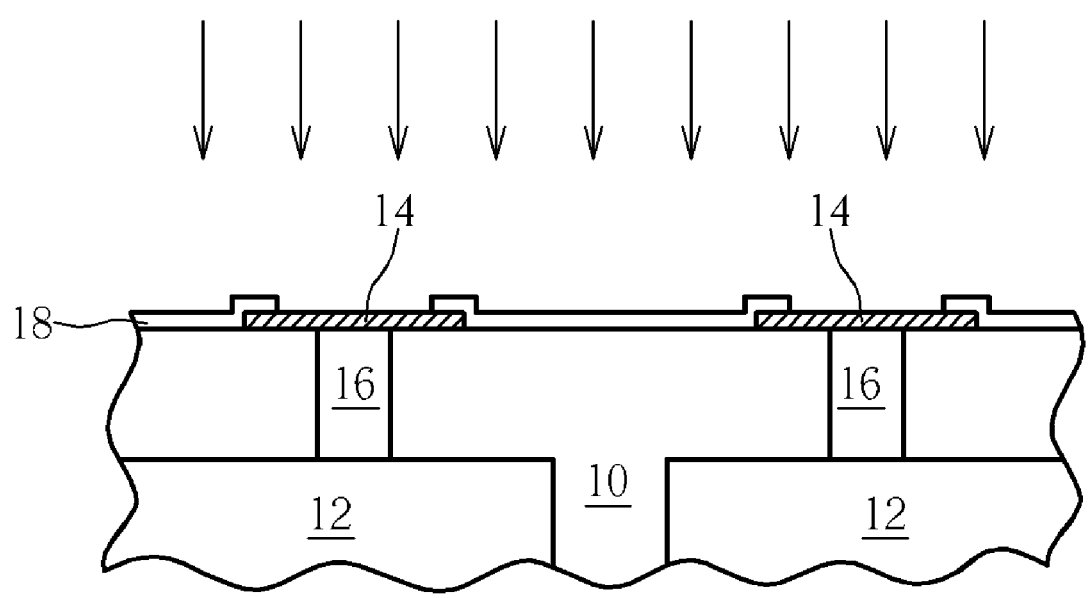
FIG. 1 through FIG. 8 are schematic diagrams illustrating a wear-resistant dielectric layer according to a preferred embodiment of the present invention.

Please refer to FIG. 1 through FIG. 8. FIG. 1 through FIG. 8 are schematic diagrams illustrating a wear-resistant dielectric layer according to a preferred embodiment of the present invention. As shown in FIG. 1, a substrate 10 is provided. The substrate 10 includes a plurality of devices 12, and a plurality of contact pads 14 disposed on the surface of the substrate 10. The devices 12 are semiconductor devices or MEMS devices, and the contact pads 14 are electrically connected to the devices 12 with contact plugs 16. The substrate 10 further includes a surface dielectric layer 18 on the surface. Subsequently, a surface treatment process is performed on the surface dielectric layer 18 to remove organic contaminations and particles adhered to the surface of the dielectric layer 18, and also to improve adhesion between the surface dielectric layer 18 and a dielectric layer (not shown) formed successively. In this embodiment, the surface treatment process includes the following steps (a) to (d):

(a) performing a rinsing process to primarily remove organic contaminations and particles adhered to the surface dielectric layer 18;

(b) performing a plasma cleaning process to further remove organic contaminations;

(c) performing a plasma etching process to increase purity and roughness of the surface dielectric layer 18; and (d) performing a plasma surface treatment process to activate the surface dielectric layer 18 for enhancing adhesion between the surface dielectric layer 18 and a dielectric layer to be formed.

Figure 2:
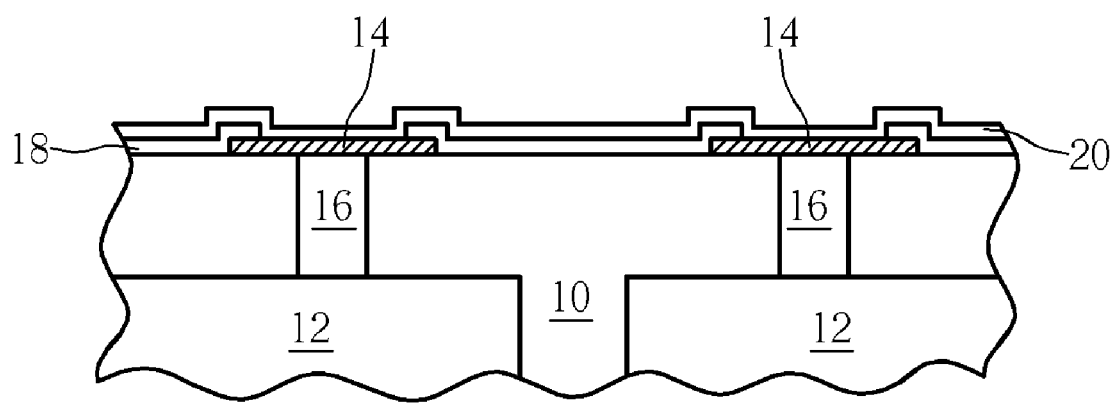
Figure 3:
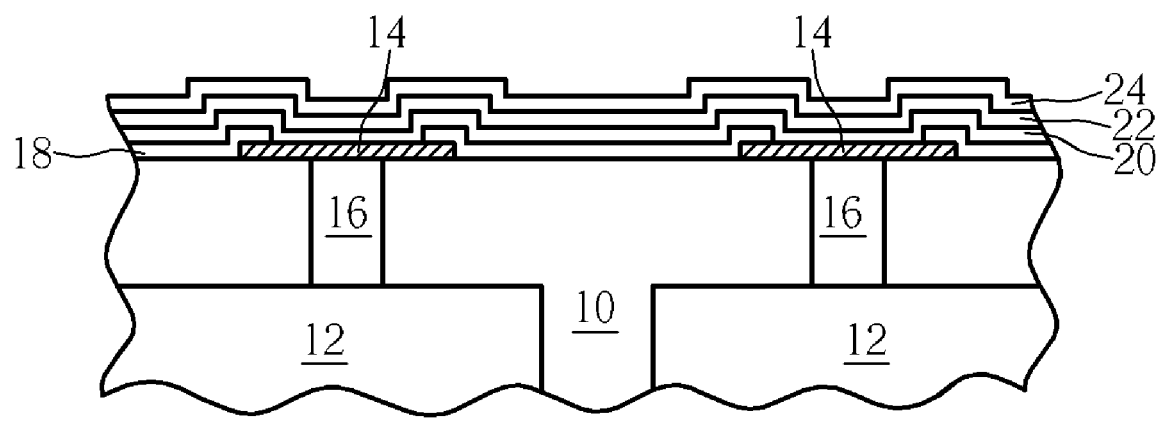

As shown in FIG. 2, a deposition process is performed to form a first silicon oxide layer 20 on the surface dielectric layer 18 and the contact pads 14. Here, the first oxide layer 20 serves as a stress buffer layer. As shown in FIG. 3, a plasma enhanced chemical vapor deposition (PECVD) process is carried out to form a silicon nitride layer 22 on the first silicon oxide layer 20. The PECVD process is performed in a high frequency/low frequency alternating manner. In this embodiment, the high frequency is approximately 13.56 MHz, and the low frequency is between 150 to 400 KHz. The silicon nitride layer 22 formed in the above manner contains less hydrogen, and thus the stress remains less than 100 MPa even though the thickness reaches between 2 and 3 micrometers. In addition, the silicon nitride layer 22 is rigid and wear-resistant. To increase hydrophilicity, a second oxide layer 24 can be then formed on the silicon nitride layer 22 by deposition, coating, immersion, or other techniques.

In the above embodiment, the silicon nitride layer 22 is formed on the surface dielectric layer 18 by performing a PECVD process in a high frequency/low frequency alternating manner, and thus the strength of the silicon nitride layer is improved and the stress is reduced. In addition, the first silicon oxide layer 20 and the second oxide layer 24 are respectively formed below and above the silicon nitride layer 22. However, the method of the present invention is not limited by the above embodiment. For instance, the surface dielectric layer 18 may be omitted, and the first silicon oxide layer 20 can be directly formed on the substrate 10. Selectively, the silicon nitride layer 22 can be directly formed on the substrate 10 or the surface dielectric layer 18 without interposing the first oxide layer 20.

Figure 4:
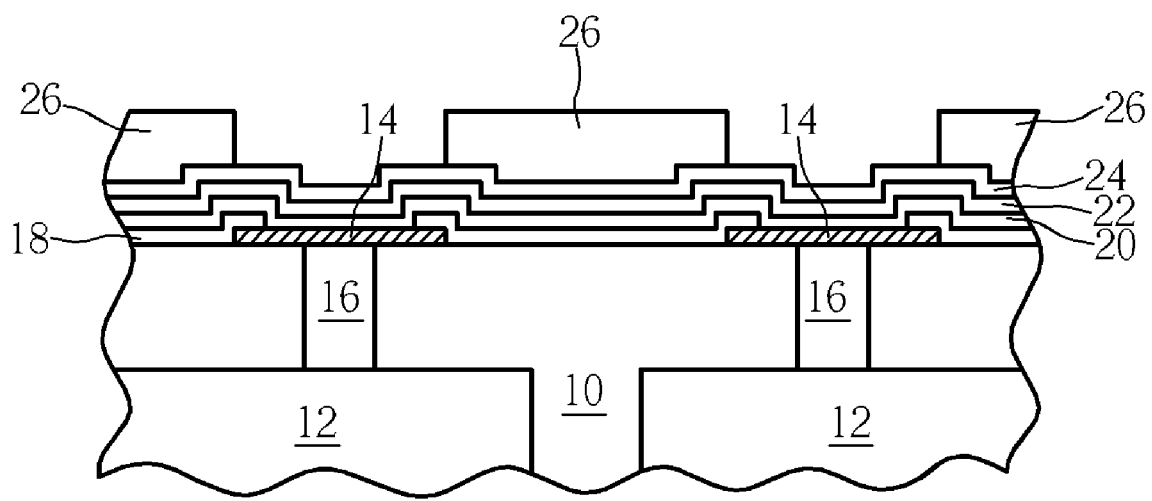
Figure 5:
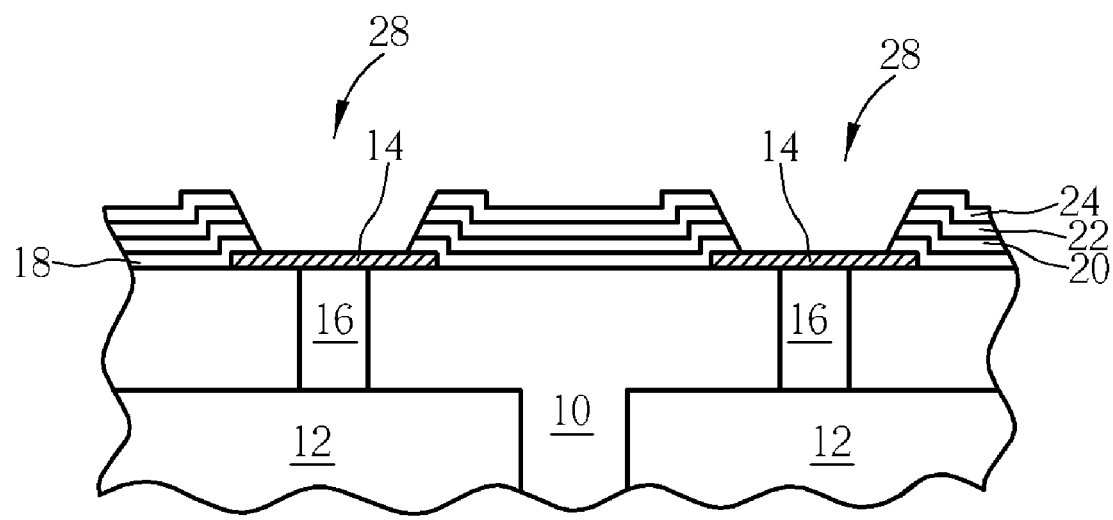

The method of the present invention further includes steps of forming dielectric openings and solder bumps. As shown in FIG. 4, a masking pattern 26, e.g. a photoresist pattern, is formed on the second silicon oxide layer 24. As shown in FIG. 5, an anisotropic etching process, such as a dry etching process, is performed remove the second oxide layer 24, the silicon nitride layer 22, and the first silicon oxide layer 20 not covered by the masking pattern 26 to form a plurality of openings 28 that expose the contact pads 14. The thickness of the masking pattern 26 is set in accordance with the thickness of the second oxide layer 24, the silicon nitride layer 22, and the first silicon oxide layer 20, so as to prevent over etching or insufficient etching problems. In addition, by tuning process parameters, such as flux and composition of etching gases, voltages, and so on, the sidewall of each opening 28 is outwardly inclined. This outwardly-inclined sidewall ensures a better step coverage effect of a thin film to be formed. In this embodiment, the inclined angle of the sidewall is between 60 to 90 degrees, and preferably between 60 to 80 degrees.

Figure 6:
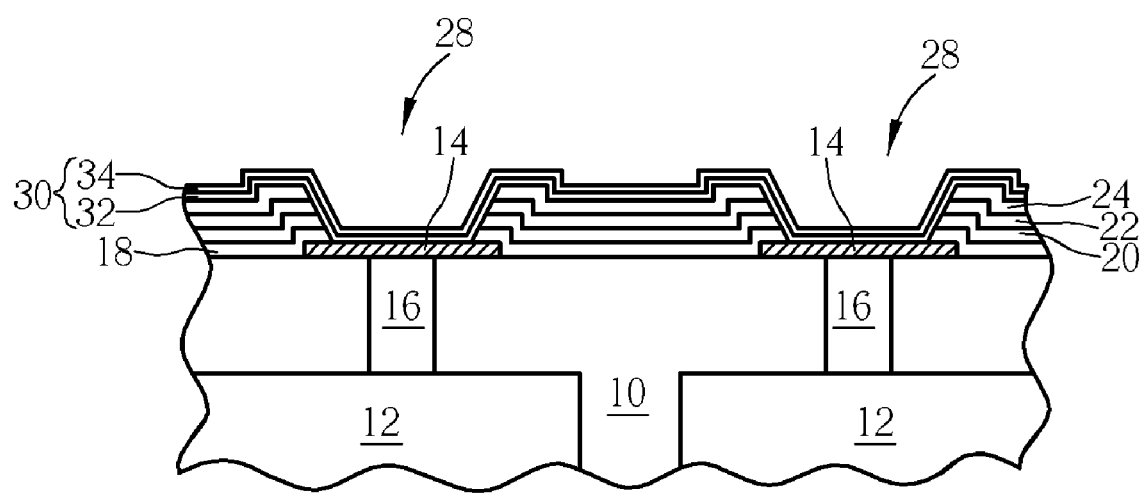

As shown in FIG. 5, the masking pattern (not shown) is removed, and a surface activation process, e.g. an oxygen plasma treatment process, is performed to improve hydrophilicity of the second oxide layer 24. As shown in FIG. 6, an under bump metallurgy (UBM) layer 30 is formed on the second silicon oxide layer 24, the sidewall of the openings 28, and the contact pads 14. The UBM layer 30 includes a diffusion barrier layer 32 and a seed layer 34. In this embodiment, the diffusion barrier layer 32 and the seed layer 34 are formed by, but are not limited to being formed by, a sputtering deposition technique. In addition, the diffusion barrier layer 32 can be a single layer, or a multi-layer structure. The material can be tungsten (W), titanium tungsten (TiW), tantalum/tantalum nitride (Ta/TaN), titanium/titanium nitride (Ti/TiN), and so forth. Subsequently, a masking pattern 36, e.g. a photoresist pattern, is formed on the seed layer 34, The masking pattern 36 exposes the openings 28 and areas around the openings 28, so as to define positions of the solder bumps (not shown) to be formed.

Figure 7:
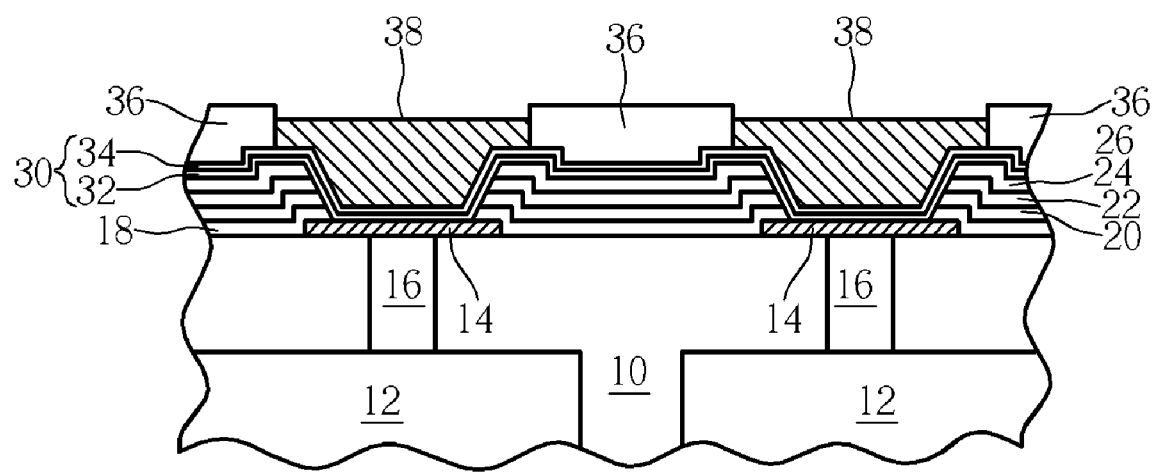
Figure 8:
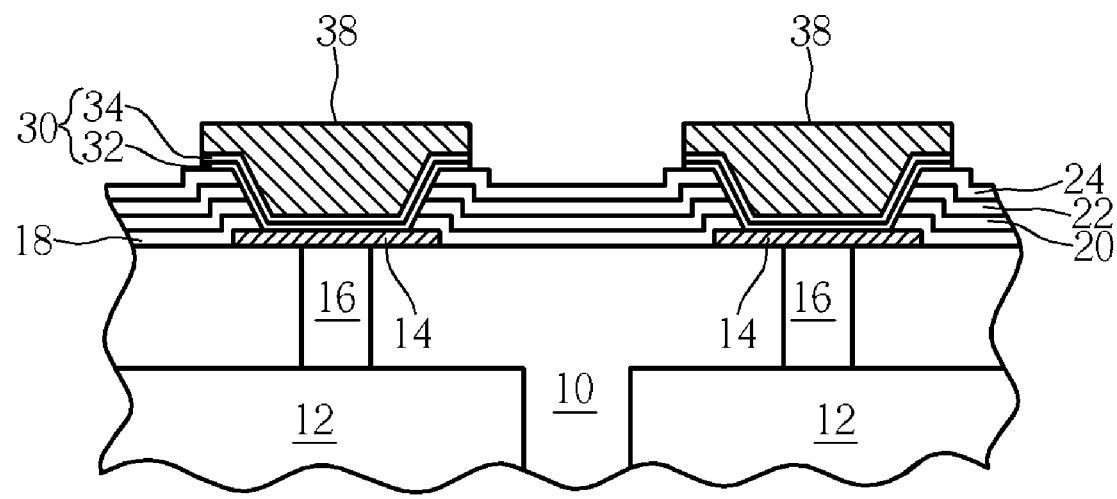

As shown in FIG. 7, plating technique, such as an electro plating process or an electroless plating process, is adopted to grow a plurality of solder bumps 38 on the surface of the seed layer 34 not covered by the masking pattern 36. As shown in FIG. 8, the masking pattern 36 is removed, together with the seed layer 34 and the diffusion barrier layer 32 not covered by the solder bumps 38.

According to the method of the present invention, a firm and low stress silicon nitride layer is formed by performing a PECVD process in a high frequency/low frequency alternating manner. In addition, outwardly-inclined openings are further formed in the silicon nitride layer, so that a good step coverage effect of the diffusion barrier layer and the seed layer is ensured. Accordingly, the solder bumps formed successively are well structured, and this improves the yield and reliability of following package process.

In comparison with the prior art, the method of the present invention is beneficial for the following reasons. First, by virtue of performing a PECVD process in a high frequency/low frequency manner, the silicon nitride layer contains less hydrogen. Consequently, the hardness of the silicon nitride layer is enhanced and the stress is reduced. Second, the dielectric layer openings are outwardly-inclined, and thus the diffusion barrier layer and the seed layer have a good step coverage effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a wear-resistant dielectric layer comprising:
   providing a substrate, the substrate comprising:
   a plurality of devices disposed in the substrate;
   a plurality of contact pads disposed on a surface of the substrate and electrically connected to the devices; and
   a surface dielectric layer positioned on the surface of the substrate, the surface dielectric layer exposing the contact pads;
   performing a surface treatment process, the surface treatment process comprising at least a plasma etching process;
   performing at least a plasma enhanced chemical vapor deposition (PECVD) process to form a dielectric layer on a surface dielectric layer, the PECVD process being performed in a high frequency/low frequency alternating manner, wherein the dielectric layer is composite dielectric layer including silicon nitride;
   forming a masking pattern on the dielectric layer, and performing an anisotropic etching process to form a plurality of openings corresponding to the contact pads in the dielectric layer, the openings exposing the contact pads, and each opening having an outwardly-inclined sidewall forming an under bump metallurgy layer (UMB) on the dielectric layer;
   forming a masking a pattern on the UMB layer, the masking pattern exposing the openings;
   forming a solder bumps by plating technique; and
   removing the masking pattern, and the UMB layer is not covered by solder bumps.

2. The method of claim 1, wherein the surface treatment process further comprises performing a rinsing process and a plasma cleaning process prior to performing the plasma etching process.

3. The method of claim 1, wherein the surface treatment process further comprises performing a plasma surface treatment process prior to performing the plasma etching process.

4. The method of claim 1, wherein the composite dielectric layer comprises a silicon nitride layer and a silicon oxide layer, and the silicon nitride layer is formed by performing the PECVD process in a high frequency/low frequency alternating manner.

5. The method of claim 1, wherein the composite dielectric layer comprises a first silicon oxide layer, a silicon nitride layer, and a second silicon oxide layer positioned from bottom to top, and the silicon nitride layer is formed by performing the PECVD process in a high frequency/low frequency alternating manner.

6. The method of claim 1, wherein an inclined angle of the sidewall of each opening is approximately between 60 to 90 degrees.

7. The method of claim 1, further comprising performing a surface activation process on the dielectric layer subsequent to forming the openings.

8. The method of claim 1, wherein the UBM layer comprises a diffusion barrier layer and a seed layer.

* * * * *